(12) United States Patent
Leighton et al.

(10) Patent No.: US 6,392,298 B1
(45) Date of Patent: May 21, 2002

(54) FUNCTIONAL LID FOR RF POWER PACKAGE

(75) Inventors: Larry Leighton, Scottsdale, AZ (US); Bengt Ahl, Gavle (SE); Thomas Moller, Gilroy; Henrik I. Hoyer, Los Gatos, both of CA (US)

(73) Assignee: Ericsson Inc., Morgan Hill, CA (US)

( * ) Notice: Subject to any disclaimer, the term of this patent is extended or adjusted under 35 U.S.C. 154(b) by 0 days.

(21) Appl. No.: 09/514,565

(22) Filed: Feb. 28, 2000

(51) Int. Cl.[7] ............................................. H01L 23/34
(52) U.S. Cl. ..................... 257/728; 257/704; 257/729; 257/578; 257/660; 257/680; 257/732; 257/784; 257/703
(58) Field of Search ................................ 257/704, 728, 257/729, 578, 660, 680, 732, 784, 703

(56) References Cited

U.S. PATENT DOCUMENTS 5,237,204 A * 8/1993 Val Christian ............... 257/698
5,523,621 A * 6/1996 Kikuchi ....................... 257/692

FOREIGN PATENT DOCUMENTS

| EP | 0 713 252 A | * | 5/1996 |
| EP | 0 778 617 A | * | 6/1997 |
| JP | 61006462 | | 1/1986 |
| JP | 62058883 | * | 3/1987 |
| JP | 3266596 | * | 10/1991 |
| JP | 8247585 | * | 9/1996 |
| JP | 411195720 A | * | 7/1999 |

* cited by examiner

Primary Examiner—Minh Loan Tran
Assistant Examiner—Luan Thai
(74) Attorney, Agent, or Firm—Lyon & Lyon LLP

(57) ABSTRACT

A packaged integrated circuit device includes a substrate including a first circuit component mounted thereon, a first conductor extending from the first circuit component, and a dielectric lid. The dielectric lid includes a component mounting surface, a second circuit component mounted on the component mounting surface, and a second conductor extending from the second circuit component. The dielectric lid is adapted to engage with the substrate such that the first circuit component is in electrical communication with the second circuit component. The second circuit component may comprises an impedance matching circuit. The circuit device may also include fastening means for securing the lid to the substrate. The fastening means may comprise an adhesive, solder, or a spring biased member.

18 Claims, 2 Drawing Sheets

FUNCTIONAL LID FOR RF POWER PACKAGE

BACKGROUND OF THE INVENTION

1. Field of the Invention

The present invention pertains generally to the field of radio frequency (RF) power transistor devices and, more specifically, to systems and methods that utilize the lid of a power transistor package to locate electrical circuit elements.

2. Background

The use of power transistor amplifiers in wireless communication applications is well known. With the considerable recent growth in the demand for wireless services, such as personal communication services (PCS), the operating frequency of wireless networks has expanded well into the gigahertz (GHz) frequencies. At these high frequencies, LDMOS transistors have been preferred for RF power amplification devices, e.g., in antenna base stations.

In a known system, an LDMOS RF power transistor package generally comprises a plurality of electrodes formed on a semiconductor die, each electrode comprising a number of transistors. The individual transistors of each electrode are connected to respective common input (gate) and output (drain) terminals formed on the surface of the die. A common ground (source) terminal substrate is formed on the underlying side of the die. The die is attached, e.g., by a known eutectic die attach process, to a metal flange serving as both a ground current reference and a heat sink. A thermally conductive, but electrically insulating, e.g., alumina, window is attached to the flange, surrounding the die. Respective input and output lead frames are attached, e.g., at opposing ends, to a top surface of the window, electrically isolated from the flange. The input and output lead frames are coupled to the respective electrode input and output terminals on the die by multiple wires, which are bonded to the respective terminals and lead frames.

By way of illustration, FIG. 1 shows a simplified electrical schematic of an unmatched LDMOS device, having an input (gate) lead 12, an output (drain) lead 14 and a source 16 through an underlying substrate. Transmission inductance through the input path, e.g., a plurality of bond wires connecting the input lead 12 to the common input terminal of the respective transistor fingers, is represented by inductance 18. Output inductance through the output path, e.g., a plurality of bond wires connecting the common output terminal of the respective transistors to the output lead 14, is represented by inductance 20.

FIG. 2 shows a known (matched) LDMOS power transistor device 40. The device 40 includes an input (gate) lead 42, output (drain) lead 44 and metallic (source) substrate 47 attached to a mounting flange 45. A first plurality of wires 48 couple the input lead 42 to a first terminal of an input matching capacitor 46. A second terminal of the input matching capacitor 46 is connected to ground (i.e., flange 45). A second plurality of wires 52 couple the first terminal of matching capacitor 46 to the respective input terminals 49 of a plurality of interdigitated electrodes 51 formed on a semiconductor die 50 attached to the metallic (source) substrate 47. By proper selection of the matching capacitor 46 and the series inductance of wires 48 and 52, the input impedance between the input lead 42 and electrode input terminals 49 can be effectively matched.

Respective output terminals 53 of the electrodes 51 are coupled to the output lead 44 by a third plurality of wires 54. In order to impedance match the output of the device, a shunt inductance is used. Towards this end, the output lead 44 is coupled to a first terminal of a DC blocking capacitor 58 (i.e., an AC short) by a fourth plurality of wires 60, the blocking capacitor 58 having a substantially lower value of reactance than the wires 60. A dielectric window substrate 24, e.g., made of aluminum oxide ("alumina"), is attached to the top surface of the mounting flange 45. The window substrate 24 has an inner perimeter 28, which defines a window 30 exposing a portion of the mounting flange surface 45.

Some known impedance matching techniques cannot be used in a conventional power transistor package because their elements occupy too much of the available substrate area. The circuit components needed to provide effective impedance matching will not physically fit in the available area on the mounting flange defined by the window substrate 24 or on the semiconductor die 50. Also, impedance matching networks that contain inductors or capacitors require an insulating substrate layer be added to the flange, or that the matching network be placed on a surrounding printed circuit board, outside the boundaries of the power transistor package. Further, some impedance matching techniques cannot be realized on the circuit board because the distance between the die and the outside of the package is too great.

It would therefore be desirable to provide an RF power transistor package that conserves space on the substrate as well as the surrounding circuit board, one in which complex impedance matching circuitry can be realized without requiring an insulating substrate layer.

SUMMARY OF THE INVENTION

A packaged integrated circuit constructed in accordance with the present invention solves the foregoing problems by incorporating circuit components in a lid that is adapted to engage with circuit components on a substrate.

In a preferred embodiment, the packaged integrated circuit includes a substrate that includes a first circuit component mounted thereon, a first conductor extending from the first circuit component, and a dielectric lid. The dielectric lid includes a component mounting surface, a second circuit component mounted on the component mounting surface, and a second conductor extending from the second circuit component. The dielectric lid is adapted to engage with the substrate such that the first circuit component is in electrical communication with the second circuit component.

In accordance with another aspect of the present invention, an RF power transistor device includes a conductive mounting flange, a dielectric window substrate attached to the mounting flange. The window substrate has a perimeter surface and exposes a portion of the mounting flange. The RF power transistor device also includes an electrical terminal attached to the perimeter surface of the window substrate, a semiconductor die attached to the exposed portion of the mounting flange, the die having an electrode formed thereon, the electrode having an input terminal and an output terminal, a dielectric lid secured to the electrical terminal and substantially covering the semiconductor die, the lid carrying an electrical component, and fastening means for mechanically attaching the lid to the window and electrically coupling the electrode to the electrical component on the lid.

In accordance with a preferred method of conserving space on an RF power transistor package, the method includes providing a dielectric lid adapted to engage with an RF power transistor package, the dielectric lid comprising an electrical component mounted on an inside surface of the lid, providing a conductor extending from the electrical component such that the conductor will engage with a circuit on the power transistor package when the lid is engaged therewith, and providing means for mechanically securing the dielectric lid to the power transistor package.

As will be apparent to those skilled in the art, other and further aspects and advantages of the present invention will hereinafter appear.

BRIEF DESCRIPTION OF THE DRAWINGS

The drawings illustrate both the design and utility of the preferred embodiments of the present invention, in which similar elements in different embodiments are referred to by the same reference numbers for purposes of ease in illustration of the invention, wherein.

DETAILED DESCRIPTION OF THE PREFERRED EMBODIMENTS

Figure 1:
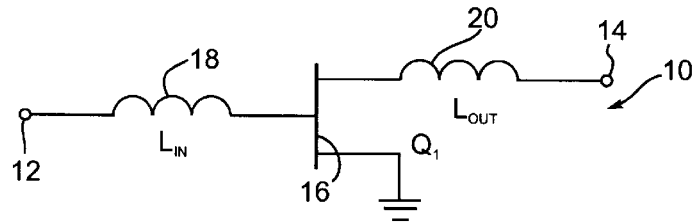
FIG. 1 is a schematic circuit diagram of an unmatched LDMOS power transistor.
Figure 2:
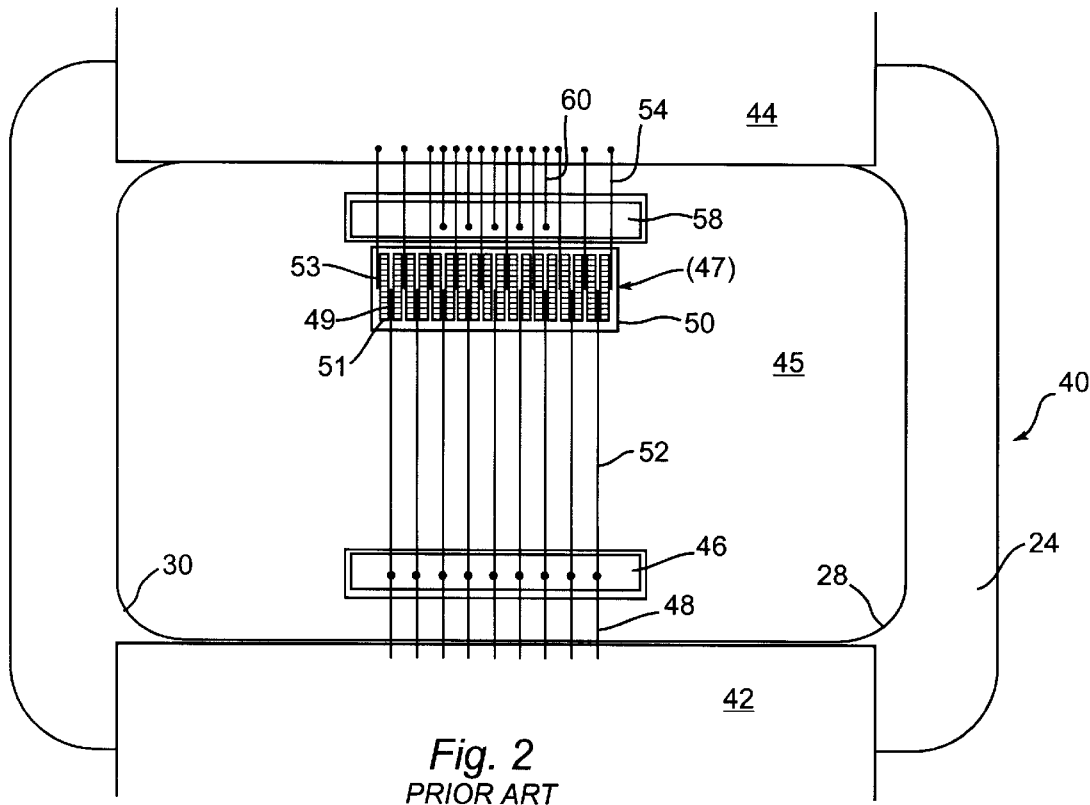
FIG. 2 is a partial top view of a prior art LDMOS RF power transistor device.
Figure 3:
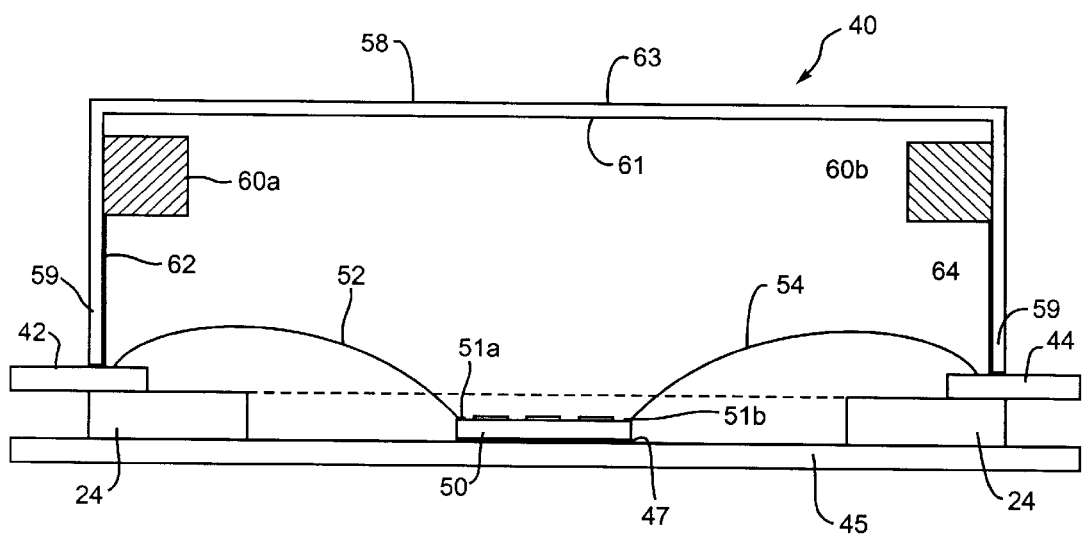
FIG. 3 is a cross sectional view of an integrated circuit package constructed in accordance with a first aspect of the present invention.

FIG. 3 depicts a packaged integrated circuit device 40, such as an LDMOS RF power transistor device, constructed in accordance with the present invention. The circuit device 40 includes an electrode 51 formed on a semiconductor die 50. The electrode is typically formed from a series of transistors. The semiconductor die 50 is attached to a plated metallic surface 47 scrubbed to a mounting flange 45 through a eutectic process. A dielectric window substrate 24, e.g., made of aluminum oxide ("alumina"), is attached to the top surface of the mounting flange 45. The window substrate 24, the semiconductor die 50, the metallic substrate 47 and the mounting flange are similar to the known RF power transistor device described in conjunction with FIG. 2. The window substrate 24 has an inner perimeter 28, which defines a window 30 exposing a portion of the mounting flange surface 45. It should be understood that a circuit device utilizing more than one electrode 51 is contemplated by the present invention.

Attached to a top surface of the window substrate 24 are an input electrical lead 42 and an output electrical lead 44. The window substrate 24 electrically insulates the input lead 42 and output lead 44 from the mounting flange 45. A first conductor 52 electrically couples a gate lead 51a of the electrode 51 to the input lead 42, and second conductor 54 electrically couples a drain lead 51b of the electrode 51 to the output lead 44. Depending on the application, the number of electrical leads 42 and 44 can vary, and while the embodiment shown in FIG. 3 includes a single input lead 42 and a single output lead 44, virtually any number of leads can be provided. Likewise, the number of wires 52 and 54 will vary depending on the specific design of the circuit device 40 and the total number of electrodes.

A lid 58 is adapted to fit over the integrated circuit device 40 so that its ends 59 maintain consistent and secure physical contact with the electrical leads 42 and 44 and the windows substrate 24. The lid 58 is preferably formed from an electrically insulating material. A ceramic material is appropriate for this purpose. Mounted to an inside surface 61 of the lid 58 are one or more circuit components 60a and 60b. The circuit components 60a and 60b may comprise an impedance matching network or another functioning component of the RF system that the device package is connected to. Examples may include resistors, memory elements, circuit capacitors, inductors, and logic devices. If the lid 58 is not entirely composed of an electrically insulating material, the circuit components 60a and 60b are preferably mounted on a portion of the lid 58 where the surface is electrically insulated.

The inclusion of circuit components 60a and 60b in the embodiment of FIG. 3 is by example only and any number of circuit components is contemplated by the present invention. The number and configuration of the circuit components will necessarily vary depending on the application they are used with and the design goals of the system.

The embodiment of FIG. 3 shows the circuit components 60a and 60b mounted on the interior surface 61 of the lid 58, however, other embodiments of a circuit device 40 in accordance with the present invention may include the circuit components 60 mounted on an exterior surface 63 of the lid 58. In such an embodiment, and depending on the application, it may be desirable to add an additional lid or other protective covering over the exposed circuit components.

The lid 58 may also be constructed to include electrically insulated substrate layers, similar to the construction of a multi layered printed circuit board. In such an embodiment, the circuit components 60a and 60b, as well as the associated electrical connections, are embedded within and between the several layers of the lid 58. In addition, the circuit components and the electrical connections can simultaneously be formed on the lid's interior or exterior surfaces.

Each of the circuit components 60a and 60b are electrically coupled to one of the input lead 42 or the output lead 44. Depending on the application more or less than the two circuit components 60a and 60b can be included in the lid 58 and more or less than two leads 42 and 44 can be used to interconnect the components. In the embodiment of FIG. 3, the circuit component 60a is electrically coupled to the input terminal 42 by a first conductor 62, and the circuit component 60b is electrically coupled to the output lead 44 by a second conductor 64. Preferably, the conductors 62 and 64 are conductive traces formed on the inside surface 61 surface of the lid 58. The conductors 62 and 64 preferably extend around the ends 59 of the lid 58 so that when the lid is engaged with the circuit device, there is an electrical pathway between the circuit components and the electrical leads. Other types of known conductors, such as insulated wires, or embedded traces, may also be used to connect the circuit components 60a and 60b to the leads 42 and 44. Since it is necessary to maintain electrical communication between the conductors 62 and 64 and the respective leads 42 or 44, it is therefore necessary to provide a consistent and secure electrical connection between the conductors 62 and 64 and the input/output terminals 42 and 44.

Figure 4:
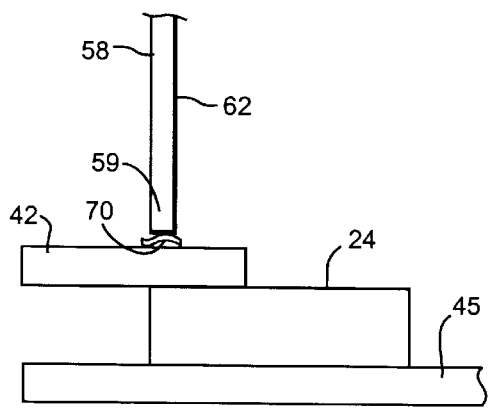
FIG. 4 depicts a first preferred connection means for securing a lid to an LDMOS RF power transistor device.

FIG. 4 shows a first means for attaching and electrically connecting the lid 58 to the circuit device 40. In FIG. 4, the ends 59 of the lid 58 is secured to the input leads 42 and 44 and therefore the mounting flange 45 by an adhesive 70.

Another suitable sealing material can also be utilized. The adhesive or sealing material 70 is preferably suitable for high temperature applications and will not interfere with the electrically conductive path between the conductors 62 or 64 and the leads 42 or 44. The adhesive or sealing material 70 is preferably formed from a conductive material that ensures a consistent and reliable conductive pathway from the conductors 60 and 62 to the leads 42 and 44.

Figure 5:
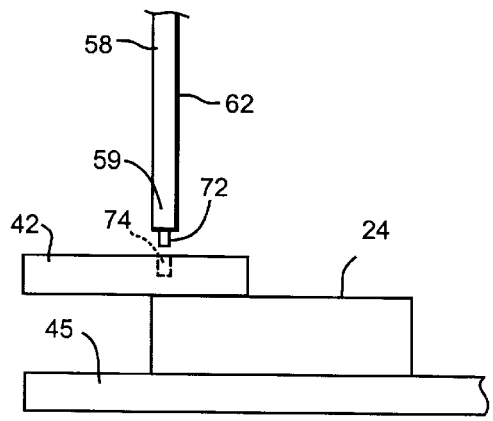
FIG. 5 depicts a second preferred connection means for securing a lid to an LDMOS RF power transistor device.

FIG. 5 shows another means for attaching and electrically connecting the lid 58 to the circuit device 40. In FIG. 5, the lid 58 is secured to the input leads 42 and 44 and therefore the mounting flange 45 by a pin 72 incorporated onto the end 59 of the lid 58. A recess 74 is included in the input lead 42 and is adapted to receive the pin 72. The recess 74 is preferably sized so that an interference fit with the pin 72 secures the lid to the circuit device 40. The pin 72 is formed on the end 59 of the lid 58 so that it is in electrical communication with the conductor 62. Therefore when the pin 72 is inserted into the recess 74, an electrical pathway is maintained between the conductor 62 and the input lead 42.

Figure 6:
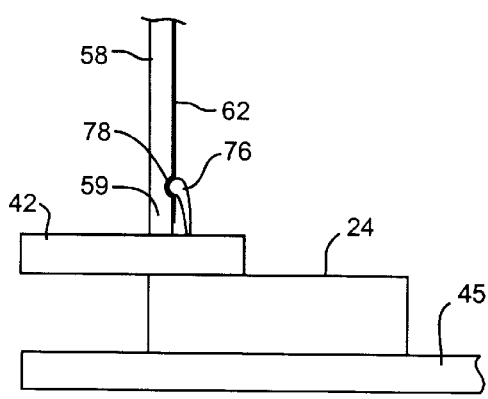
FIG. 6 depicts a third preferred connection means for securing a lid to an LDMOS RF power transistor device.

FIG. 6 shows a further means for attaching and electrically connecting the lid 58 to the circuit device 40. In FIG. 6, the lid 58 is secured to the leads 42 and 44 and therefore the mounting flange 45 by a spring-biased member 76. The end 59 of the lid 58 includes a recess 78 on its interior surface 61 that is adapted to engage with the spring-biased member 76 when the lid 58 is engaged with the circuit device 40. Pressure exerted by the spring-biased member on the inside surface 61 of the lid 58 secures the lid 58 to the circuit device 40. The spring-biased member 76 is in electrical communication with the conductor 62 so that when the spring-biased member 76 engages within the recess 78, an electrical pathway is maintained between the conductor 62 and the input lead 42. Similarly, the spring biased member 76 may be included on the lid with the recess 78 included on the leads 42 and 44.

Figure 7:
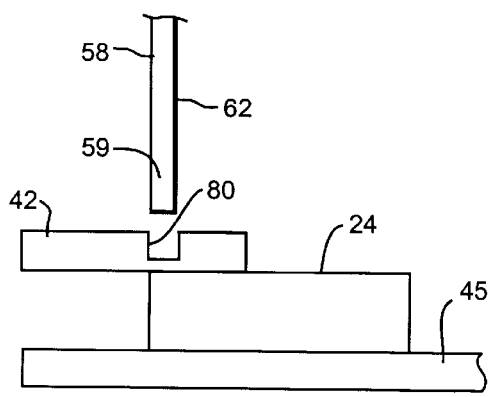
FIG. 7 depicts a fourth preferred connection means for securing a lid to an LDMOS RF power transistor device.

FIG. 7 shows a further means for attaching and electrically connecting the lid 58 to the circuit device 40. In FIG. 7, the lid 58 is secured to the input leads 42 and 44 and therefore the mounting flange 45 by a sleeved recess 80 formed in the input lead 42. The sleeved recess forms an interference fit with the end 59 of the lid 58. Since the conductor 62 extends into the recess 80, an electrical pathway is maintained between the conductor 62 and the input terminal 42.

One skilled in the art will readily recognize that various other mechanical fastening means may be incorporated in a circuit device constructed in accordance with the present invention.

Although the invention has been described and illustrated in the above description and drawings, it is understood that this description is by example only and that numerous changes and modifications can be made by those skilled in the art without departing from the true spirit and scope of the invention. The invention, therefore, is not to be restricted, except by the following claims and their equivalents.

What is claimed is:

1. A packaged integrated circuit device, comprising:
    a substrate including a first circuit component mounted thereon;
    a first conductor extending from the first circuit component; and
    a dielectric lid, the dielectric lid comprising
        a component mounting surface;
        a second circuit component mounted on the component mounting surface; and
        a second conductor extending from the second circuit component;
        wherein the dielectric lid is adapted to engage with the substrate such that the first circuit component is in electrical communication with the second circuit component.

2. The circuit device of claim 1, wherein the first circuit component comprises:
    a semiconductor die;
    an electrode mounted on a first surface of the semiconductor die; and
    an electrically conductive mounting flange attached to a second surface of the semiconductor die.

3. The circuit device of claim 1, wherein the second circuit component comprises an impedance matching circuit.

4. The circuit device of claim 1, wherein the substrate comprises:
    a mounting flange;
    a dielectric window substrate attached to the mounting flange;
    a first electrical lead attached to the window substrate;
    wherein the first conductor and the second conductor are in electrical communication with the first electrical lead.

5. The circuit device of claim 4, further comprising fastening means for securing the lid to the substrate.

6. The circuit device of claim 5, wherein the fastening means comprises an electrically conductive adhesive.

7. The circuit device of claim 5, wherein the fastening means comprises an electrically conductive solder weld.

8. The circuit device of claim 5, wherein the fastening means comprises solder.

9. The circuit device of claim 5, wherein the fastening means comprises a pin attached to the lid and a recess in the first electrical lead adapted to engage with the pin.

10. The circuit device of claim 5, wherein the fastening means comprises a spring biased member attached to the first electrical lead and adapted to engage with a recess in the lid.

11. The circuit device of claim 5, wherein the fastening means comprises a recess in the first electrical lead adapted to receive the lid and form an interference fit therewith.

12. The circuit device of claim 1, wherein the first circuit component is a power transistor.

13. The circuit device of claim 1, wherein the lid is formed from a ceramic material that is thermally, but not electrically, conductive.

14. The circuit device of claim 1, wherein the second circuit component is mounted on an interior surface of the lid.

15. The circuit device of claim 1, wherein the second circuit component is mounted on an exterior surface of the lid.

16. The circuit device of claim 15, further comprising a second lid, wherein the second lid encloses the second circuit component.

17. The circuit device of claim 1, wherein the lid is a multi-layered substrate and the second circuit component is mounted on a layer of the substrate.

18. An RF power transistor device, comprising:

a conductive mounting flange;

a dielectric window substrate attached to the mounting flange, the window substrate having a perimeter surface, the window substrate exposing a portion of the mounting flange;

an electrical terminal attached to the perimeter surface of the window substrate;

a semiconductor die attached to the exposed portion of the mounting flange, the die having an electrode formed thereon, the electrode having an input terminal and an output terminal;

a dielectric lid secured to the electrical terminal and substantially covering the semiconductor die, the lid carrying an electrical component; and fastening means for mechanically attaching the lid to the window and electrically coupling the electrode to the electrical component on the lid.

* * * * *